US012587186B2

(12) United States Patent
Kim

(10) Patent No.: US 12,587,186 B2
(45) Date of Patent: Mar. 24, 2026

(54) SWITCH CONTROL DEVICE AND BATTERY PACK INCLUDING THE SAME

(71) Applicant: SAMSUNG SDI CO., LTD., Yongin-si (KR)

(72) Inventor: Kiseon Kim, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 349 days.

(21) Appl. No.: 18/378,729

(22) Filed: Oct. 11, 2023

(65) Prior Publication Data

US 2024/0364326 A1 Oct. 31, 2024

(30) Foreign Application Priority Data

Apr. 25, 2023 (KR) ........................ 10-2023-0054247

(51) Int. Cl.
H03K 17/22 (2006.01)
B60L 3/00 (2019.01)
H03K 3/356 (2006.01)
H03K 17/687 (2006.01)

(52) U.S. Cl.
CPC .......... H03K 17/223 (2013.01); B60L 3/0046 (2013.01); H03K 3/356008 (2013.01); H03K 17/687 (2013.01)

(58) Field of Classification Search
CPC .... B60L 3/0046; H03K 17/22; H03K 17/223; H03K 17/687; H03K 3/356008
USPC ................. 327/108, 109, 110, 111, 142, 143
See application file for complete search history.

(56) References Cited

U.S. PATENT DOCUMENTS

| | | | | |
|---|---|---|---|---|
| 5,485,580 | A | * | 1/1996 | Takai ................ H04L 12/40013 |
| | | | | 709/250 |
| 2019/0077272 | A1 | | 3/2019 | Newman et al. |
| 2021/0005411 | A1 | | 1/2021 | Tzivanopoulos et al. |
| 2021/0151982 | A1 | | 5/2021 | Cho et al. |
| 2023/0146895 | A1 | | 5/2023 | Choi |
| 2024/0212954 | A1 | | 6/2024 | Trichon et al. |

FOREIGN PATENT DOCUMENTS

| | | | |
|---|---|---|---|
| EP | | 1 607 268 A1 | 12/2005 |
| EP | | 2 575 155 B1 | 9/2019 |
| EP | | 3790139 A1 | 9/2019 |
| EP | | 3761338 A1 | 6/2020 |

(Continued)

OTHER PUBLICATIONS

Extended European Search Report dated Feb. 1, 2024, for corresponding European Patent Application No. 23193457.1.

(Continued)

*Primary Examiner* — William Hernandez
(74) *Attorney, Agent, or Firm* — Lee IP Law, P.C.

(57) ABSTRACT

A switch control device includes a retention circuit configured to generate a trigger signal based on a fault signal indicating whether a fault indicated by a power signal occurred, generate a reset signal based on the trigger signal, store a present value of a driving signal at a time during a duration of an active edge of the trigger signal, and output the stored driving signal as a retention signal during a time duration of the reset signal; and a driving circuit configured to generate a switch control signal based on the retention signal and the driving signal, and output the switch control signal to a switch.

20 Claims, 4 Drawing Sheets

(56)               References Cited

FOREIGN PATENT DOCUMENTS

| | | |
|---|---|---|
| EP | 3 975 218 B1 | 3/2022 |
| FR | 3 122 283 A1 | 10/2022 |
| KR | 10-2020-0092208 A | 8/2020 |
| KR | 10-2021-0059326 A | 5/2021 |
| KR | 10-2022-0065603 A | 5/2022 |
| WO | WO 2019/051144 A2 | 3/2019 |

OTHER PUBLICATIONS

EP Office Action dated Jan. 27, 2025, for corresponding European Patent Application No. 23193457.1.

\* cited by examiner

SWITCH CONTROL DEVICE AND BATTERY PACK INCLUDING THE SAME

CROSS-REFERENCE TO RELATED APPLICATION

This application claims priority to and the benefit of Korean Patent Application No. 10-2023-0054247, filed on Apr. 25, 2023, in the Korean Intellectual Property Office, the entire disclosure of which is incorporated herein by reference.

BACKGROUND

1. Field

The present disclosure relates to a switch control device and a battery pack including the same.

2. Description of the Related Art

The battery pack may be connected to an electronic device driven by the battery pack through a switch such as a relay or contactor. If a fault occurs in the electronic device, a control signal for controlling the switch may not be maintained, and as a result, a dangerous condition may arise wherein serious accidents may occur.

For example, if a control device that controls the switch is reset due to a fault of the control device in an electric vehicle powered by a battery, an electrical connection between the battery pack and the vehicle body may be unintentionally disconnected. If it is assumed that the vehicle is driving at high speed, disconnection of such an electrical connection may lead to a fatal accident.

In order to solve this problem, the battery pack may be designed to include a retention circuit for maintaining the operating state of the switch in the previous state for a predetermined time if a fault in the control device occurs.

SUMMARY

Embodiments are directed to a switch control device that may be used, for example, to control a switch connecting a battery to a load.

In at least one embodiment, there may be provided a switch control device and a battery pack including the switch control device, capable of maintaining an operating state of a switch in a previous state for a predetermined time if an abnormality occurs as indicated by a power signal.

According to an aspect, a switch control device may include a retention circuit that may be configured to generate a trigger signal based on a fault signal indicating whether a fault is detected from a power signal, generate a reset signal based on the trigger signal, pick a driving signal during a time of an active edge of the trigger signal, and output the picked driving signal as a retention signal during a time set by the reset signal; and a driving circuit that may be configured to generate a switch control signal based on the retention signal and the driving signal and output the switch control signal to a switch.

The retention circuit may include a trigger signal generator that may be configured to generate the trigger signal using the fault signal having a first level or a second level different from the first level in response to whether the fault occurs; a reset signal generator that may be configured to generate a reset signal having a third level or a fourth level different from the third level according to whether the trigger signal exceeds a reference voltage; and a retention signal generator that may be configured to pick the driving signal at an active edge of the trigger signal according to the fault signal of the first level, and output the picked driving signal as the retention signal during a time period in which the reset signal has the third level.

The retention signal generator may be configured to output a voltage corresponding to a logic level of 0 as the retention signal if the reset signal is at the fourth level.

The retention signal generator may include a first resistor having one end connected to a power terminal for supplying a power voltage; a capacitor connected between another other end of the first resistor and a ground; and a diode having an anode connected to a first node that is also connected to the first resistor and the capacitor, and a cathode receiving the fault signal, wherein the trigger signal may correspond to the voltage of the first node.

The reset signal generator may include a transistor turned on or off in response to the trigger signal and having a first terminal connected to a power terminal and a second terminal connected to a ground.

The retention signal generator may include a D flip-flop having a first input terminal to which the driving signal is input, a second input terminal to which the trigger signal is input, a reset terminal to which the reset signal is input, and an output terminal to output a logic level as the retention signal.

The active edge may be a falling edge.

The drive circuit may be configured to generate the switch control signal from the retention signal and the drive signal.

According to another aspect, a battery pack may be provided. The battery pack may include a battery module having at least one cell, a switch connected between the battery module and a load, and a switch control device configured to turn the switch on or off using a switch control signal, wherein the switch control device may include a retention circuit configured to generate a trigger signal based on a fault signal indicating whether a fault was detected from a power signal, generate a reset signal based on the trigger signal, pick a driving signal at a time during a duration of an active edge of the trigger signal, and output the picked driving signal as a retention signal during a time set by the reset signal; and a driving circuit that may be configured to generate a switch control signal based on the retention signal.

The retention circuit may include a trigger signal generator that may be configured to generate the trigger signal using the fault signal having a first level or a second level different from the first level in response to whether the fault occurs, a reset signal generator that may be configured to generate a reset signal having a third level or a fourth level different from the third level according to whether the trigger signal exceeds a reference voltage, and a retention signal generator that may be configured to pick the driving signal at a time during a duration of an active edge of the trigger signal according to the fault signal of the first level, output the picked driving signal as the retention signal during a time period in which the reset signal has the third level, and output a voltage corresponding to a logic level of 0 as the retention signal if the reset signal is at the fourth level.

The retention signal generator may include a first resistor having one end connected to a power terminal for supplying a power voltage, a capacitor connected between another end of the first resistor and a ground, and a diode having an anode connected to a first node that is also connected to the first resistor and the capacitor, and a cathode receiving the fault signal, wherein the trigger signal may correspond to the voltage of the first node.

The reset signal generator may include a transistor turned on or off in response to the trigger signal, and having a first terminal connected to the power terminal and a second terminal connected to ground.

The retention signal generator may include a D flip-flop having a first input terminal to which the driving signal is input, a second input terminal to which the trigger signal is input, a reset terminal to which the reset signal is input, and an output terminal to output a logic level as the retention signal, wherein an active edge may be a falling edge of the trigger signal input to the D flip-flop.

In yet another aspect, embodiments are directed to a switch control device having a retention circuit configured to output a retention signal and a driving circuit configured to receive the retention signal and output a switch control signal, wherein a rise time of a trigger signal (e.g., by RC charging) sets a duration of a reset signal, and a (e.g., rapid) fall of the trigger signal (e.g., by discharge through a diode) causes a driving signal (e.g., a driving signal value close to the time of the fault) to be stored as a retention signal at a time during a duration of the fall of the trigger signal (e.g., stored by and in a D flip-flop if the trigger signal falls rapidly), and wherein the retention signal is output to the driving circuit during the duration of the reset signal, and the trigger signal is based on a fault indicated by a power signal (e.g., so that the driving signal may be maintained during the duration of the reset signal, which includes the time of the fault).

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
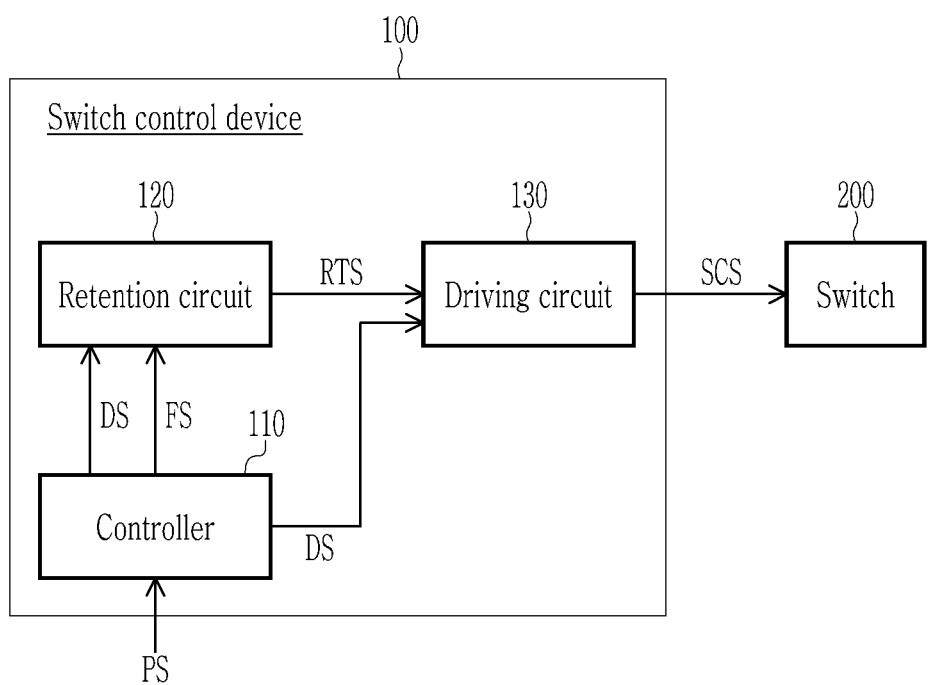
FIG. 1 is a schematic diagram showing a switch control device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals refer to like elements throughout.

In the embodiments described with reference to the drawings in this specification, the order of elements may be changed, elements may be merged, some elements may be divided, and specific additional elements may be added.

Throughout the specification and claims, if a part is referred to "include" a certain element, it may mean that it may further include other elements rather than exclude other elements, unless specifically indicated otherwise.

In addition, expressions described in the singular may be interpreted in the singular or plural unless explicit expressions such as "one" or "single" are used.

In addition, terms including an ordinal number, such as first, second, etc., may be used to describe various elements, but the elements are not limited by the terms. The above terms are used only for the purpose of distinguishing one element from another element. For example, without departing from the scope of the present disclosure, a first element may be referred to as a second element, and similarly, a second element may be referred to as a first element.

Furthermore, if a component is referred to be "connected" with another component, it includes not only the case where two components are "directly connected" but also the case where two components are "indirectly or non-contactedly connected" with another component interposed therebetween, or the case where two components are "electrically connected." On the other hand, if an element is referred to as "directly connected" to another element, it should be understood that no other element exists in the middle.

FIG. 1 is a schematic diagram showing a switch control device according to an embodiment.

Referring to FIG. 1, the switch control device 100 may control an operation state of the switch 200. The switch control device 100 may generate a switch control signal SCS for controlling the operation state of the switch 200 and output the switch control signal SCS to the switch 200.

The switch control device 100 may include a controller 110, a retention circuit 120, and a driving circuit 130.

The controller 110 may determine whether to turn on or turn off the switch 200 and output a driving signal DS for operating the switch 200 to the driving circuit 130. The controller 110 may also output the driving signal DS to the retention circuit 120. As an example, the controller 110 may output a driving signal DS having a high level to turn on the switch 200 and a driving signal DS having a low level to turn off the switch 200.

The controller 110 may detect a fault from the power signal PS. The power signal PS may include a power voltage supplied from a power supply device (not shown in the drawings) to the controller 110 and the switch control device 100. The controller 110 may output a fault signal FS corresponding to whether the fault has occurred to the retention circuit 120. As an example, the controller may output a fault signal FS having a high level if the power signal PS is normal, and output a fault signal FS having a low level if the fault is detected from the power signal PS. Meanwhile, the controller 110 may receive a fault signal FS corresponding to whether the fault has occurred from a power supply device (not shown in the drawings).

Also, the controller 110 may control the driving signal DS in response to the fault signal FS. For example, if the power signal is normal, a driving signal DS having a high level may be output in response to the fault signal FS having the high level. In addition, if the fault is detected from the power signal, a driving signal DS having a low level may be output in response to the fault signal FS having the low level. Alternatively, the controller 110 may output the drive signal DS separately from the fault signal FS.

In an embodiment, the high level of each signal may indicate a power supply voltage (e.g., 3.3V or 5V) of the controller 110 or a voltage level close to the power supply voltage of the controller 110, and the low level of each signal may indicate a ground voltage (0V) or a voltage level close to the ground voltage (0V).

The retention circuit 120 may generate a retention signal RTS based on the fault signal FS and output the retention signal RTS to the driving circuit 130. The retention circuit 120 may generate the retention signal RTS based on the fault signal FS so that the switch 200 maintains the previous state for a predetermined time. For example, if a fault is detected from the power signal, the retention circuit 120 may receive the fault signal FS having the low level, and may output the retention signal RTS having the high level for a predetermined period of time.

The driving circuit 130 may receive the driving signal DS and the retention signal RTS, respectively. The driving circuit 130 may generate a switch control signal SCS based on the driving signal DS and the retention signal RTS, and output the switch control signal SCS to the switch 200.

The driving circuit 130 may include a logic gate that receives the driving signal DS and the retention signal RTS as inputs. For example, the driving circuit 130 may output a switch control signal SCS having a low level if both the driving signal DS and the retention signal RTS have a low level, and output a switch control signal SCS having a high level if at least one of the driving signal DS and the retention signal RTS has a high level.

The switch 200 may operate in an on state or an off state according to the switch control signal SCS. As an example, the switch 200 may be turned on in response to the switch control signal SCS having the high level and turned off in response to the switch control signal SCS having the low level.

The switch 200 may include, for example, a contactor or a relay.

According to an embodiment, if a fault is detected from the power signal, the retention circuit 120 operates, and the retention signal RTS may become a high level for the predetermined time. If the fault is detected, the driving circuit 130 may output a switch control signal SCS having the high level by the retention signal RTS having the high level for the predetermined time. Accordingly, the switch 200 may maintain an on state for a predetermined time. In this way, if the fault is detected from the power signal, a phenomenon in which the switch 200 is suddenly opened may be prevented or averted.

Figure 2:
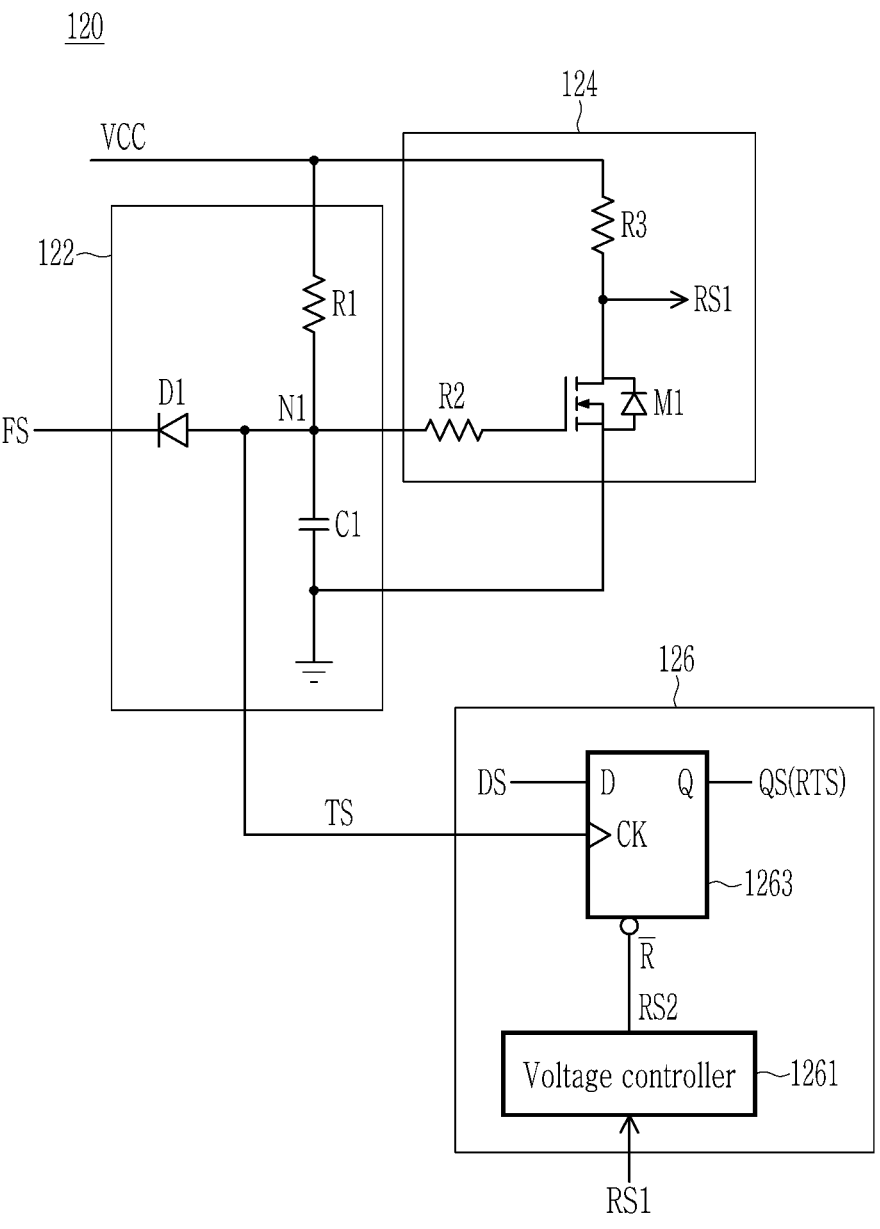
FIG. 2 is a diagram showing a retention circuit shown in FIG. 1, in detail.

FIG. 2 is a schematic diagram showing a retention circuit shown in FIG. 1, in detail.

Referring to FIG. 2, the retention circuit 120 may include a trigger signal generator 122, a reset signal generator 124, and a retention signal generator 126.

The trigger signal generator 122 may generate a trigger signal TS by charging and discharging the capacitor C1 using the fault signal FS, and output the trigger signal TS to the retention signal generator 126.

The trigger signal generator 122 may include a diode D1, a resistor R1 and a capacitor C1. The fault signal FS may be applied to a cathode of the diode D1, and an anode of the diode D1 may be connected to the node N1.

The resistor R1 and the capacitor C1 may be connected in series between a power terminal supplying the power voltage VCC and the ground. The power voltage VCC may be, for example, 3.3V. Specifically, one end of the resistor R1 may be connected to the power terminal, and another end of the resistor R1 may be connected to one end of the capacitor C1. Another end of capacitor C1 may be connected to ground. The fault signal FS is input to the cathode of the diode D1, and the anode of the diode D1 may be connected to a node N1 corresponding to a connection point between the anode of the diode, the resistor R1, and the capacitor C1. If a fault signal FS having a high level is input, a voltage may be charged across the capacitor C1 as current flows from the power terminal (VCC), and through the resistor R1, due to the voltage difference between the voltage of the node N1 and the fault signal FS having the high level. Meanwhile, if the fault signal FS having the low level is input, the voltage of the capacitor C1 may be discharged as current flows through the diode D1. That is, the voltage of the node N1 may vary according to the fault signal FS, and the trigger signal TS corresponding to the voltage of the node N1 may be generated. The trigger signal TS may correspond to the voltage of the node N1.

The reset signal generator 124 may generate a reset signal RS1 having a different level depending on whether the trigger signal TS exceeds a reference voltage, and output the reset signal RS1 to the retention signal generator 126.

The reset signal generator 124 may include a transistor M1, a resistor R2 and a resistor R3. The transistor M1 may be implemented with various transistors such as a field effect transistor (FET) and a bipolar transistor that perform a switching function, even though a FET is shown. Although the transistor M1 is shown as an N-type transistor in FIG. 2, a P-type transistor may be used as the transistor M1. Because the gate of the transistor M1 serves as a control terminal, the gate of the transistor M1 may be termed a "control terminal." Because the drain of the transistor M1 is one terminal of the transistor M1, it may be used as the term "first terminal or second terminal," and because the source of the transistor M1 is also one terminal of the transistor M1, it may be used as the term "first terminal or second terminal."

The gate of transistor M1 may be connected to node N1. The resistor R2 may be connected between the node N1 and the gate of the transistor M1. The drain of the transistor M1 may be connected to the power terminal supplying the power supply voltage VCC through a resistor R3, and the source of the transistor M1 may be connected to ground. The drain voltage of the transistor M1 may correspond to the reset signal RS1.

In the reset signal generator 124, the transistor M1 may be turned on or off in response to the voltage of the node N1, that is, the trigger signal TS. Since the transistor M1 is N-type, the transistor M1 may be turned off if the voltage of the node N1 is lower than a threshold voltage of the transistor M1, and the transistor M1 may be turned on if the voltage of the node N1 is higher than the threshold voltage of the transistor M1. If the transistor M1 is turned off, the drain voltage of the transistor M1 becomes the power supply voltage VCC, so that a reset signal RS1 having a high level may be output. Meanwhile, if the transistor M1 is turned on, since the drain voltage of the transistor M1 becomes 0V, a reset signal RS1 having a low level may be output. That is, the reset signal generator 124 may output the reset signal RS1 having a high level or low level to the retention signal generator 126 according to the trigger signal TS corresponding to the voltage of the node N1.

The retention signal generator 126 may generate the retention signal RTS using the driving signal DS and the trigger signal TS, and output the retention signal RTS to the driving circuit 130. The retention signal generator 126 may pick the driving signal DS at a time during a duration of the active edge of the trigger signal TS, and output the picked driving signal DS as the retention signal RTS for a predetermined time. The predetermined time may be determined based on a duration of the reset signal RS1. The duration may be determined by an RC charging time.

The retention signal generator 126 may include a voltage controller 1261 and a D flip-flop 1263.

The voltage controller 1261 may convert the reset signal RS1 to match the input of the D flip-flop 1263 and output the converted reset signal RS2 to the reset terminal R (complement). of the D flip-flop 1263.

The D flip-flop 1263 may have two input terminals D and CK and an output terminal Q. Also, the D flip-flop 1263 may have a reset terminal R (complement). The reset terminal R (complement) may mean an active low that is activated at a low level. The driving signal DS may be input to the input terminal D, and a trigger signal TS may be input to the input terminal CK. The D flip-flop 1263 may determine a value output to the output terminal Q according to an active edge of the trigger signal TS input to the input terminal CK. As an example, the D flip-flop 1263 may select a value of the driving signal DS at a time during a duration of the falling edge of the trigger signal TS and output it to the output terminal Q. As such, since the D flip-flop 1263 uses a falling edge trigger, an active edge that triggers a state change of the D flip-flop 1263 may be a falling edge.

The D flip-flop 1263 may perform a reset function according to the reset signal RS2 input to the reset terminal R (complement). The reset function may mean outputting a logic level '0' (e.g., a low level voltage) to the output terminal Q regardless of signals input to the two input terminals D and CK. As an example, the D flip-flop 1263 may operate to output a value of driving signal DS stored at a time during a duration of an active edge of the trigger signal TS, if a reset signal RS2 having a high level is input to the reset terminal R (complement), and may output the logic level '0' to the output terminal Q regardless of signals input to the two input terminals D and CK if a reset signal RS2 having a low level is input to the reset terminal R (complement). That is, the D flip-flop 1263 may output a value "picked" or selected at a time during a duration of the falling edge of the trigger signal TS to the output terminal Q during the period in which the reset signal RS2 maintains the high level, and may perform a reset function in response to the signal RS2 having the low level reset.

Figure 3:
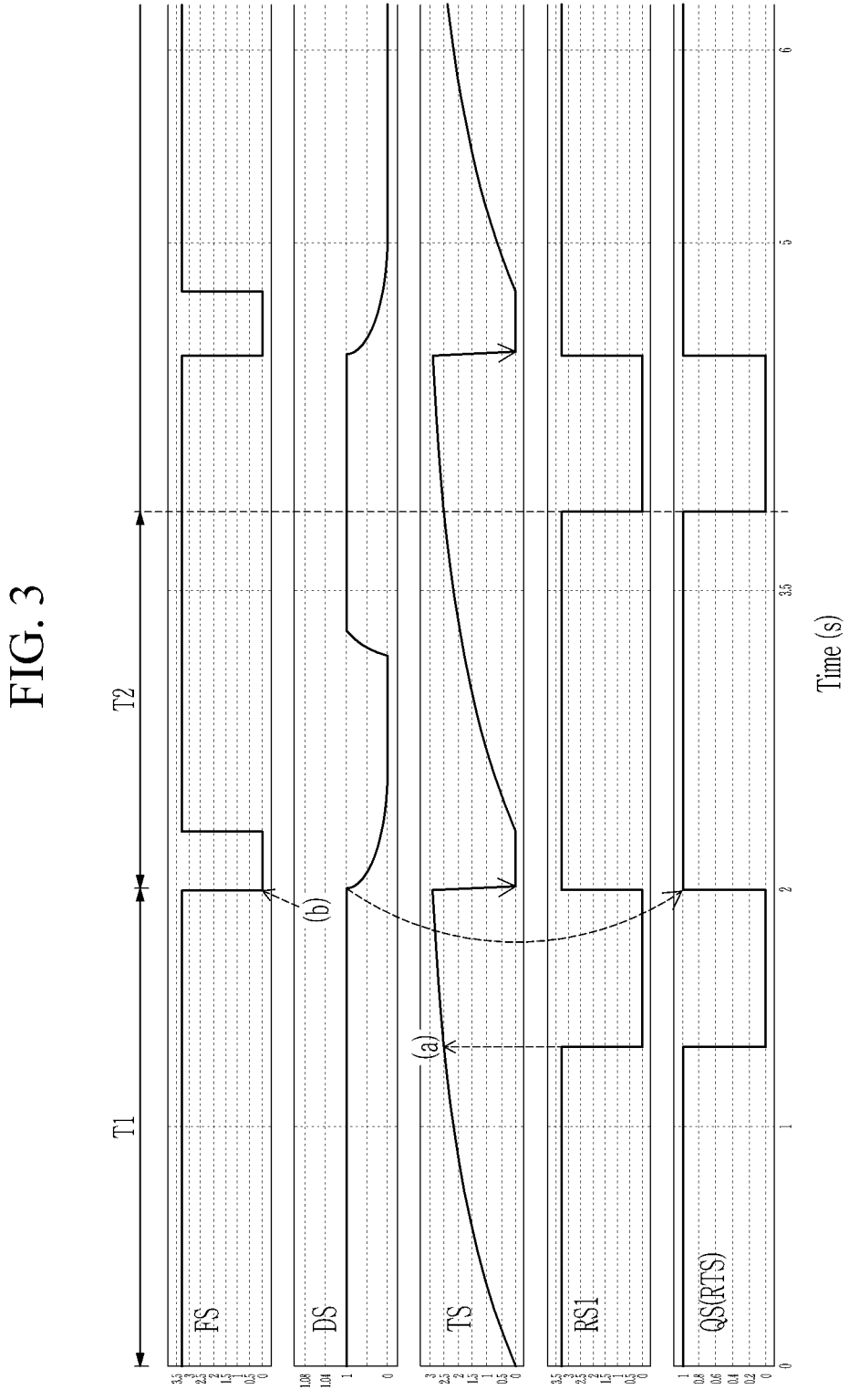
FIG. 3 is a diagram showing an example of an operating waveform of the retention circuit shown in FIG. 2.

FIG. 3 is a diagram showing an example of an operating waveform of the retention circuit shown in FIG. 2.

Referring to FIG. 3, the controller 110 may output a fault signal FS having the high level if the power signal is indicative of normal status and output a fault signal FS having the low level if a fault is detected from the power signal. In addition, if the power signal indicates normal, a driving signal DS having the high level may be output, and if the fault in the power signal is detected, a driving signal DS having the low level may be output.

In the period T1 during which the power signal indicates normal, a fault signal FS having the high level applied to the cathode of the diode D1, and a driving signal DS having the high level is applied to the input terminal D of the D flip-flop 1263. Then, the capacitor C1 is charged while current flows from the power terminal (VCC) and through the resistor R1. As the capacitor C1 is charged, the voltage of the trigger signal TS corresponding to the voltage of the node N1 increases exponentially. Because the voltage of the trigger signal TS is used as the turn-on voltage of the transistor M1, if the voltage of the trigger signal TS increases and becomes the turn-on voltage of the transistor M1 at the time point (a), the transistor M1 may be turned on. Because the transistor M1 is turned off prior to the time point (a), the reset signal RS1 having a high level may be input to the reset terminal R (complement) of the D flip-flop 1263 prior to the time point (a). Here, although it has been described that the high-level reset signal RS1 is input to the reset terminal R (complement) of the D flip-flop 1263, the reset signal RS1 having the high level may be input to the reset terminal R (complement) through the voltage controller 1261. Meanwhile, because the transistor M1 is turned on after the time point (a), the reset signal RS1 having a low level may be input to the reset terminal R (complement) of the D flip-flop 1263.

Therefore, in the period T1 during which the power signal indicates normal, before time point (a), because the driving signal DS having the high level and the fault signal having the high level are respectively input to the two input terminals D and CK of the D flip-flop 1263, and the reset signal RS1 having the high level is input to the reset terminal R (complement) of the D flip-flop 1263, and the CK terminal (i.e. TS) becomes a low value, a picked or selected value of DS near the time of a fault may be output as the output signal QS. Here, it is assumed that the previous value of DS is a high level. Meanwhile, because the reset signal RS1 having the low level is input to the R (complement) terminal of the D flip-flop after the time point (a), the D flip-flop 1263 may output a logic level '0' as the output signal QS. That is, in the period T1 in which the power signal indicates normal, the retention signal RTS having the high level may be output to the driving circuit 130 before time point (a), and the retention signal RTS having the low level may be output to the driving circuit 130 after time point (a).

The level of the retention signal RTS is changed before and after the time point (a) in the period T1 in which the power signal indicates normal, but the driving circuit may output a switch control signal SCS having the high level by the driving signal DS having the high level. Accordingly, in the period T1 in which the power signal indicates normal, the switch 200 may maintain a turned-on state.

On the other hand, if a fault is detected from the power signal, a fault signal FS having the low level may be input to the retention circuit 120 at time point (b), and a driving signal DS having the low level in response to the fault signal FS having the low level may be input to the retention circuit 120 and the driving circuit 130. At time point (b), the fault signal FS having the low level may be applied to the cathode of the diode D1, and the driving signal DS having the low level may be input to the input terminal D of the D flip-flop 1263. Then, the capacitor C1 may be discharged while the current flows through the diode D1. Because there is no resistor in the discharge path of the capacitor C1, the capacitor C1 may be discharged significantly faster than the charging of the capacitor C1, and the trigger signal TS corresponding to the voltage of the node N1 may be rapidly reduced. In FIG. 3, the voltage of the trigger signal TS is shown to immediately decrease to 0V, but this may indicate that the voltage of the trigger signal TS decreases significantly faster than the rate at which the voltage of the trigger signal TS increases according to the charging of the capacitor C1.

Also, if the voltage of the trigger signal TS is equal to or less than the turn-on voltage of the transistor M1, the transistor M1 may be turned off, and the reset signal RS1 having the high level may be input to the reset terminal R (complement) of the D flip-flop 1263. Because the D flip-flop 1263 may pick and output the driving signal DS having the high level during a time of the falling edge of the trigger signal TS, it may output the output signal QS having the high level at time point (b). The output signal QS having the high level output from the D flip-flop 1263 may be maintained until the transistor M1 is turned on again and the reset signal RS1 having the low level is input to the reset terminal R (complement) of the D flip-flop 1263. If a fault is detected from the power signal, the fault signal FS is low level for a short time and then becomes high level again. Therefore, as described in the period T1, the voltage of the trigger signal TS gradually increases by RC charging, according to the fault signal FS having the high level, and if the voltage of the trigger signal TS is equal to the turn-on voltage of the transistor M1, the transistor M1 may be turned on. During the period T2 in which the transistor M1 is turned off again from the time point (b), the retention circuit 120 may output the retention signal RTS having the high level to the driving circuit 130.

The driving signal DS having the low level is input to the driving circuit 130 due to the occurrence of a fault indicated by the power signal at time point (b), but the driving circuit 130 may output a switch control signal SCS having the high level by the retention signal RTS having the high level during the period T2. Accordingly, during the period T2, the switch 200 may maintain a turned-on state.

Without such a retention circuit 120, the driving circuit 130 may output the switch control signal SCS having the low level by the driving signal DS having the low level according to the occurrence of a fault indicated by the power signal, and accordingly the switch 200 may be turned off, and an unintended accident may occur. However, according to an embodiment, the retention circuit 120 may output a retention signal RTS having the high level for a predetermined time (e.g., T2 period) if a fault indicated by the power signal occurs, and accordingly the switch 200 may maintain the turn-on state.

Such a retention circuit 120 may provide a retention function without using timers or IC components of existing retention circuits.

Figure 4:
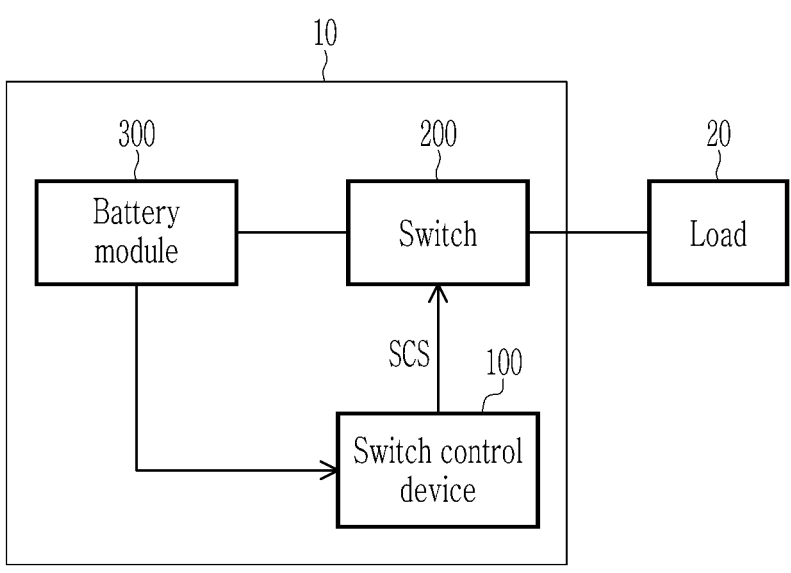
FIG. 4 is a diagram showing a battery pack, including a switch control device, according to an example embodiment.

FIG. 4 is a diagram showing a battery pack, including a switch control device according to an example embodiment.

Referring to FIG. 4, the battery pack 10 may include a battery module 300, a switch 200 and a switch control device 100.

The battery module 300 may include at least one cell connected in series or parallel to each other.

The switch 200 may control electrical connection between the battery module 300 and the load 20. The switch 200 may be turned on or off in response to the switch control signal SCS output from the switch control device 100. As an example, the switch 200 may be turned on in response to a switch control signal SCS having a high level and turned off in response to a switch control signal SCS having a low level.

The switch 200 may include a contactor or a relay, and the like.

The switch control device 100 may output a switch control signal SCS for controlling a state of the switch 200 to the switch 200. As described based on FIGS. 1 to 3, the switch control device 100 may include a controller 110, a retention circuit 120 and a driving circuit 130. The retention circuit 120 may generate the retention signal RTS using the driving signal DS and the fault signal FS, and the driving circuit 130 may generate a switch control signal SCS by implementing a logic gate for the retention signal RTS and the driving signal DS. In particular, the retention circuit 120 may generate a retention signal RTS having a high level for a predetermined time if a fault indicated by the power signal occurs, so that the driving circuit 130 may output a switch control signal SCS having a high level for the predetermined period of time.

The controller 110 of the switch control device 100 may be a battery management system (BMS) of the battery pack 10. In this case, the controller 110 may output a fault signal FS based on the state information of the battery module 300, the power information used in the battery pack 10, the setting information of the system (e.g., vehicle) in which the battery pack 10 is installed, and the like.

According to an embodiment, the retention function may be provided using an abnormal occurrence signal without a timer or integrated circuit (IC) component of an existing retention circuit. In addition, since there is no need to use an IC component or timer, costs may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

DESCRIPTION OF SYMBOLS

10: battery pack
20: load
100: switch control device
110: controller
120: retention circuit
130: drive circuit
200: switch

What is claimed is:

1. A switch control device, comprising:
a retention circuit configured to generate a trigger signal based on a fault signal indicating whether a fault indicated by a power signal occurred, generate a reset signal based on the trigger signal, store a driving signal during a time of an active edge of the trigger signal, and output the stored driving signal as a retention signal during a time duration of the reset signal; and
a driving circuit configured to generate a switch control signal based on the retention signal and the driving signal and output the switch control signal to a switch.

2. The switch control device as claimed in claim 1, wherein the retention circuit comprises:
a trigger signal generator configured to generate the trigger signal using the fault signal having a first level or a second level different from the first level in response to whether the fault occurs;
a reset signal generator configured to generate a reset signal having a third level or a fourth level different from the third level according to whether the trigger signal exceeds a threshold voltage; and
a retention signal generator configured to store the driving signal at the time of the active edge of the trigger signal according to the fault signal of the first level, and output the stored driving signal as the retention signal during a time period in which the reset signal has the third level.

3. The switch control device as claimed in claim 2, wherein the retention signal generator is configured to output a voltage corresponding to a logic level of 0 as the retention signal if the reset signal is at the fourth level.

4. The switch control device as claimed in claim 2, wherein the retention signal generator comprises:
a first resistor having one end connected to a power terminal for supplying a power voltage;

a capacitor connected between another end of the first resistor and a ground; and a diode having an anode connected to a first node and a cathode receiving the fault signal, the first resistor and capacitor also connected to the first node; and wherein the trigger signal corresponds to a voltage of the first node.

5. The switch control device as claimed in claim 4, wherein the reset signal generator comprises a transistor turned on or off in response to the trigger signal, and has a first terminal connected to the power terminal and a second terminal connected to a ground.

6. The switch control device as claimed in claim 5, wherein the retention signal generator comprises a D flip-flop having a first input terminal to which the driving signal is input, a second input terminal to which the trigger signal is input, a reset terminal to which the reset signal is input, and an output terminal to output a logic level as the retention signal.

7. The switch control device as claimed in claim 6, wherein the active edge is a falling edge.

8. The switch control device as claimed in claim 1, wherein the driving circuit is configured to generate the switch control signal from the retention signal and the drive signal.

9. A battery pack, comprising:

a battery module comprising at least one cell;

a switch connected between the battery module and a load; and a switch control device configured to turn the switch on or off using a switch control signal, the switch control device including:

a retention circuit configured to generate a trigger signal based on a fault signal indicating whether a fault was indicated by a power signal, generate a reset signal based on the trigger signal, store a driving signal at a time during a duration of an active edge of the trigger signal, and output the stored driving signal as a retention signal during a time duration of the reset signal; and a driving circuit configured to generate a switch control signal based on the retention signal.

10. The battery pack as claimed in claim 9, wherein the retention circuit comprises:

a trigger signal generator configured to generate the trigger signal using the fault signal having a first level or a second level different from the first level in response to whether the fault occurs;

a reset signal generator configured to generate a reset signal having a third level or a fourth level different from the third level according to whether the trigger signal exceeds a reference voltage; and a retention signal generator configured to store the driving signal at the time of the active edge of the trigger signal according to the fault signal of the first level, output the stored driving signal as the retention signal during a time period in which the reset signal has the third level, and output a voltage corresponding to a logic level of 0 as the retention signal if the reset signal is at the fourth level.

11. The battery pack as claimed in claim 10, wherein the retention signal generator comprises:

a first resistor having one end connected to a power terminal for supplying a power voltage;

a capacitor connected between another end of the first resistor and a ground; and a diode having an anode connected to a first node and a cathode receiving the fault signal, the first resistor and capacitor also connected to the first node;

wherein the trigger signal corresponds to a voltage of the first node.

12. The battery pack as claimed in claim 11, wherein the reset signal generator comprises a transistor turned on or off in response to the trigger signal, and has a first terminal connected to the power terminal and a second terminal connected to a ground.

13. The battery pack as claimed in claim 11, wherein the retention signal generator comprises a D flip-flop, the retention signal generator having:

a first input terminal to which the driving signal is input, a second input terminal to which the trigger signal is input, a reset terminal to which the reset signal is input, and an output terminal to output a logic level as the retention signal, wherein the active edge is a falling edge.

14. A switch control device, comprising:

a retention circuit configured to output a retention signal; and a driving circuit configured to receive the retention signal and output a switch control signal; wherein a rise time of a trigger signal sets a duration of a reset signal, and a fall of the trigger signal causes a driving signal to be stored as a retention signal at a time during a duration of the fall of the trigger signal; and the retention signal is output to the driving circuit during the duration of the reset signal, and the trigger signal is based on a fault indicated by a power signal.

15. The switch control device as claimed in claim 14, wherein the driving signal stored as a retention signal is stored via connection to a D terminal of a D flip-flop.

16. The switch control device as claimed in claim 15, wherein the reset signal duration begins if the trigger signal reaches a threshold voltage of a transistor, with one terminal of the transistor being connected to an input of the D flip-flop.

17. The switch control device as claimed in claim 16, wherein the node corresponding to the trigger signal is connected to a clock input of the D flip-flop.

18. The switch control device as claimed in claim 17, wherein the reset signal is input to a reset terminal of the D flip-flop through a voltage controller to provide a compatible voltage to the reset terminal of the D flip-flop.

19. The switch control device as claimed in claim 18, wherein a set terminal of the D flip-flop is connected to a ground.

20. The switch control device as claimed in claim 14, wherein a node corresponding to the trigger signal is connected to a resistor, a capacitor and an anode of a diode, such that the rise time of the trigger signal by RC charging of the capacitor is significantly longer than the duration of the fall of the trigger signal by discharge of the capacitor through the diode.

* * * * *